United States Patent [19]

Fournel et al.

[11] Patent Number: 5,665,627
[45] Date of Patent: Sep. 9, 1997

[54] METHOD OF IRREVERSIBLY LOCKING A PORTION OF A SEMICONDUCTOR DEVICE

[75] Inventors: Richard Pierre Fournel, Trets; Serge Fruhauf, Peynier; François Tailliet, Epinay Sur Seine, all of France

[73] Assignee: SGS Thomson Microelectronics S.A., Saint Genis, France

[21] Appl. No.: 467,699

[22] Filed: Jun. 6, 1995

Related U.S. Application Data

[62] Division of Ser. No. 345,117, Nov. 28, 1994, abandoned.

[30] Foreign Application Priority Data

Nov. 30, 1993 [FR] France ................... 93 14330

[51] Int. Cl.$^6$ ............................ H01L 21/70; H01L 27/00
[52] U.S. Cl. ............................ 438/467; 438/468
[58] Field of Search ................... 437/922, 52, 47, 437/60

[56] References Cited

U.S. PATENT DOCUMENTS 4,935,645  6/1990  Lee ........................................... 307/362
5,008,855  4/1991  Eltoukhy et al. ......................... 365/96
5,298,784  3/1994  Gambino et al. ....................... 257/529

FOREIGN PATENT DOCUMENTS 2 247 779  5/1992  United Kingdom ............ H01L 27/02

OTHER PUBLICATIONS

Patent Abstracts of Japan, vol. 12, No. 265 (E–637) JP–A–63048837 Jul. 23, 1988.
Patent Abstracts of Japan, vol. 12, No. 265 (E–637) JP–A–63048838 Jul. 23, 1988.

*Primary Examiner*—Jey Tsai
*Attorney, Agent, or Firm*—Wolf, Greenfield & Sacks, P.C.; James H. Morris

[57] ABSTRACT

A fuse for an integrated circuit is constituted by a shallow NP junction, covered with a metal contact, the semiconductor region being not excessively doped. For the blowing of the fuse, the junction is forward biased with a current sufficient to enable a diffusion of metal up to the junction. This short-circuits the junction. The detection is done also by the forward biasing of the junction, but with a low current or a low voltage. The detection can also be done with reverse biasing.

18 Claims, 1 Drawing Sheet

METHOD OF IRREVERSIBLY LOCKING A PORTION OF A SEMICONDUCTOR DEVICE

This application is a division of application Ser. No. 08/345,117, filed Nov. 28, 1994, entitled FUSE FOR INTEGRATED CIRCUIT, now abandoned.

BACKGROUND OF THE INVENTION

1. Field of the Invention

The invention relates to integrated circuits and, more specifically, it relates to the making of irreversible locking elements that can be used to permanently modify the functions of certain parts of the circuit or access to these parts.

The standard term "fuse" shall be used hereinafter to designate these locking elements, it being understood nevertheless that this is a figure of speech referring to a function and that the structure of these elements does not necessarily implement a physical fusing operation.

2. Discussion of the Related Art

A common application of fuses in the field of integrated circuits relates to chip cards: it is often sought to prohibit access to memory zones or to certain functions, the prohibition being applied progressively as these cards go through the stages of being manufactured and marketed.

A typical example is the following one: the card manufactured by a card manufacturer must initially have all its points of access authorized and all its functions authorized if only for testing purposes. Then, certain confidential data elements have to be made inaccessible: for example, the card manufacturer does not wish the programs of the operating system (which are in the read-only memory in the chip) to be accessible in read mode. One or more fuses are blown to prohibit this hitherto possible reading operation. The card may then be delivered, for example to a provider of a service (a bank, telephone company, etc.). The provider of the service will place other programs and confidential data in the card (in a programmable memory), and may wish to physically prohibit read and write access to these programs and data elements. Other fuses could be blown at this point in time.

Fuses presently used in this type of application include, for example:

polycrystalline silicon fuses in which a breakdown current is applied to a very thin layer of polycrystalline silicon, which gets heated and evaporates, opening the circuit in which it is placed. This type of fuse has problems of reliability related to poor evaporation and the risk that the conductor will be reconstituted over a period of time.

oxide breakdown EEPROM type electrically programmable memory cellsin which the blank state of the cell is likened to an intact state of the fuse and the programmed state is likened to a blown state. This type of lock is very reliable if an external programming voltage of sufficient energy is used, but it is far less reliable if the voltage used is a voltage internal to the integrated circuit chip. The use of an external voltage has several drawbacks. For example, greater cost due to an additional supply terminal, which is also troublesome for the user who has to plan for this voltage. Furthermore, the breakdown occurs through the application of a series of voltage pulses, but if the breakdown is not successful at the first attempt it becomes pregressively more difficult;

blank EEPROM memory cells with a zener diode on source or drain, which can be erased once but never again reprogrammed. A high voltage is necessary for breakdown with the conventional drawbacks that this entails. The drawbacks include the need for an external voltage with a specific access pad or an internal voltage, but an internal voltage is less reliable and requires providing a voltage pull-up circuit on the chip.

One general aim of the invention is to provide a particularly simple type of fuse that can work at very low voltage. Other aims of the invention will become apparent upon reading the following description.

SUMMARY OF THE INVENTION

According to the invention, it is proposed to make a fuse by means of a very shallow NP semiconductor junction coated with metal that is capable, when it gets heated, of being diffused in the semiconductor until the junction is short-circuited.

The state of the junction can then be detected by a simple detection circuit.

The invention may include a shallow, doped semiconductor region (for example, about some tenths of a micrometer) diffused in a semiconductor region having an opposite type of conductivity and a metal contact formed on the doped region, the metal of the contact being capable of getting diffused throughout the depth of the doped region in the presence of a sufficient density of blow-out current applied between the contact and the region of an opposite type.

The semiconductor region of an opposite type could be the semiconductor substrate in which the integrated circuit is formed. But it is simple to provide a structure where the semconductor region of an opposite type is a well diffused in a substrate with a type of conductivity opposite to that of the substrate.

The contact metal may be aluminium. The current density that must be applied to obtain sufficient heating and this sufficient diffusion of the metal towards the junction may be approximately 1 millampere per square micrometer of contact surface, for example. The period of application of the current may reach some seconds.

In the case of Standard MOS technology integrated circuits with transistors formed by implantation of source and drain self-aligned by a gate, the shallow doped region may be a region formed simultaneously with these source and drain implantations. The doping may be, for example, of the order of $10^{18}$ to approximately $10^{20}$ atoms/cm$^3$. In CMOS (complementary MOS) technology, comprising N channel transistors formed in the P– type substrate and P channel transistors formed in N type wells, the shallow doped region may be made by means of an implantation identical to a source or drain of a P channel transistor in an N type well.

A detection circuit may be used to detect the state of the fuse. This detection circuit may have means for the forward biasing of the junction between the diffused region and the region of an opposite type. The biasing means may be a voltage biasing consisting of the application of a low voltage, for example on the order of tenths of volts or current biasing means consisting of the application of a low current, for example on the order of microamperes.

If a current bias is used, the detection may include examining the voltage generated at the terminals of the fuse. A threshold comparator may be used to determine whether the voltage present between the metal contact and the opposite type of semiconductor region is a forward biased NP junction voltage (i.e. representative of an intact junction) or a drop in voltage at the terminals of a low-value resistor (i.e. representative of a junction short-circuited by the metal).

In practice, the threshold of the comparator may be in a range between about 0.2 to 0.3 volts and about 0.5 to 0.6 volts. An appropriate value for the threshold is about 0.3 volts. The threshold value may be produced by a forward biased and non-fused diode.

If, however, the biasing used is a voltage biasing, the current flowing in the fuse may be detected and compared with a threshold value. For example, a current mirror may be provided to detect the current of the fuse and carry it into a resistor so as to create, at the terminals of this resistor, a voltage drop representing the current that flows through the fuse. The voltage drop thus created therefore represents the state of the fuse. An appropriate choice of the conversion ratio of the current mirror and of the value of the resistor will make it possible to select a value of voltage appearing at the terminals of the resistor that, in a binary manner, represents the fused or non-fused state of the fuse.

In accordance with one feature of a fuse according to the invention, the fuse is blown by the application of a forward biasing current of the junction. However, it may also be desired to read the fuse state by subjecting it to forward biasing. Reading the fuse state using a forward bias may be accomplished by:

either a comparator with a very low threshold capable of distinguishing between an intact fuse exhibiting a voltage drop of 0.6 to 0.7 volts and a blown fuse exhibiting a voltage drop of 0.1 to 0.2 volts;

or another system of precise detection capable of identifying a difference between the current flowing through a forward biased junction and the current flowing through a junction short-circuited by diffusion of aluminum.

It is also possible to read the state of the fuse by reverse biasing the junction between the shallow doped region and the well in which it is formed. The reading and blowing circuitry is more complex but the difference between the blown state of the fuse (i.e. a short-circuited junction) and the non-blown state (i.e. a reverse biased junction) is easier to detect.

BRIEF DESCRIPTION OF THE DRAWINGS

Other features and advantages of the invention shall appear from the following detailed description, made with reference to the appended drawings, of which.

DETAILED DESCRIPTION

The fuse according to one aspect of the invention therefore essentially has a shallow PN semiconductor junction covered with metal. The metal is capable of diffusing into the junction in response to a rise in temperature, to the extent of short-circuiting the junction.

The junction is forward-biased during the blowing of the fuse as well as during reading of the state of the fuse.

Figure 1:
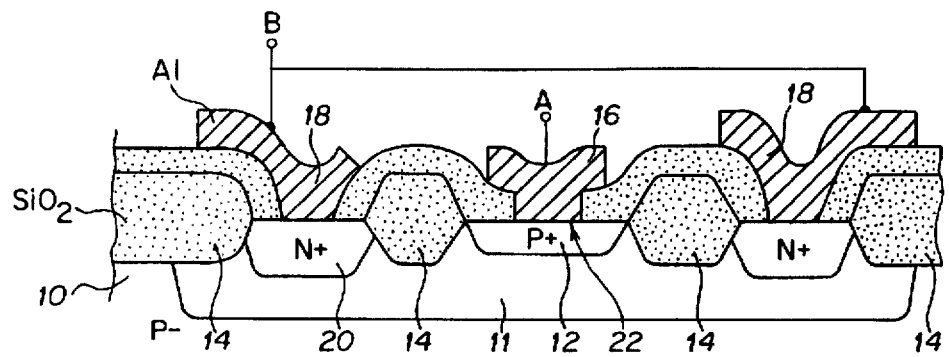
FIG. 1 shows a cross-section of the fuse according to the invention.

In the exemplary embodiment of FIG. 1, the junction is formed by a semiconductor region 12 of the P+ type formed in an N type well 11, itself formed in a P− type of semiconductor substrate 10. The types of conductivity could furthermore be all reversed.

The semiconductor may be silicon.

The P+ type region 12 may be demarcated laterally by thick insulating zones 14, preferably made of thick silicon oxide formed by localized thermal oxidation. The size of the region 12 may be some micrometers long by some micrometers wide.

The depth of the region 12 is small: some tenths of a micrometer, preferably about 0.2 micrometers.

The concentration of N type impurities in the well is preferably the same as that used to form the wells of the P channel transistors of CMOS integrated circuits. This concentration is, for example, $10^{18}$ to $10^{19}$ atoms per $cm^3$ approximately. The doping impurity may be phosphorus or arsenic, for example.

The concentration of P+ type impurities in the shallow region 12 is preferably the same as that used to form the self-aligned sources and drains of the P channel MOS transistors. This concentration is, for example, about $10^{18}$ to $10^{20}$ atoms per $cm^3$ approximately. The doping impurity may be boron, for example.

The upper part of the region 12 is in contact with a metal conductor 16 forming a first terminal A of the fuse. Another metal conductor 18, electrically connected to the N− well, constitutes the other terminal B of the fuse. The conductors may be made of aluminium, for example, which is a metal commonly used in the field of silicon integrated circuits.

Aluminium has good properties of diffusion in silicon in the presence of a rise in temperature. This is why it is possible to make the conductor 16 out of aluminium. Other metals with similar properties could also be used instead of aluminium.

The conductor 18 is in contact with an N+ type diffused region 20 that is locally diffused on the surface of the well and enables the setting up of an ohmic contact between the N well and the terminal B. This N+ region 20 is separated from the P+ region 12, for example by a portion of a thick insulator oxide region 14. The N+ region 20 may surround the entire region 12. FIG. 1 corresponds to an embodiment where the N+ region 20 surrounds region 12, and this is why an N+ region 20 is seen on either side of the shallow region 12.

The conductor 16 comes into contact with at least one part of the surface of the region 12, for example on a surface area of 1 micrometer by 1 micrometer at its center. The contact is designated by 22 in FIG. 1.

The fuse works as follows.

While the fuse is intact, it constitutes a simple NP diode between the terminals A and B. When this diode is forward-biased by a sufficient read current, there is a voltage drop of about 0.6 to 0.7 volts at its terminals. The read current is adjusted by a current source. The read current applied may be some microamperes for a junction surface area of about 10 square micrometers.

To blow the fuse, a high current is applied to its terminals in forward bias, resulting in a current density possibly reaching a value of about 1 milliampere per square micrometer at the position of the contact 22 between the metal of the terminal A and the P+ region 12. The ohmic resistance at the position of the contact is substantial, because the region 12 is not heavily doped. The heating by the Joule effect prompts a substantial rise in temperature in the vicinity of the contact, melting the aluminium and the silicon in the vicinity of the contact. Aluminium and silicon form a eutectic material at a far lower temperature than the melting temperatures of either aluminium or silicon, alone.

The aluminium then diffuses into the silicon, towards the junction between the region 12 and the N well. If a sufficient quantity of aluminium diffuses into the vicinity of the NP junction, then the NP junction will be practically short-circuited. The fuse is then in its blown state. The period of application of the current may be some seconds, for example 10 seconds, to achieve this result. In order to facilitate this process, the NP junction is shallowly located with respect to contact 22.

In the blown state, the fuse no longer behaves like a diode but like a simple low-value resistor. The reading current applied, for example some microamperes, generates a drop in voltage which can hardly exceed some tens of millivolts. This voltage drop is far less than the drop in voltage at the terminals of the intact junction.

In order to be used as a circuit locking element, the fuse is placed in a circuit that enables both an electrical blow-out command and a state detection command. A blow-out command circuit and a state detection circuit are therefore associated with the fuse.

The use of a direct reading fuse has the advantage that one of the terminals of this diode is permanently connected to the ground. Therefore, attempts at fraud are more difficult.

Figure 2:
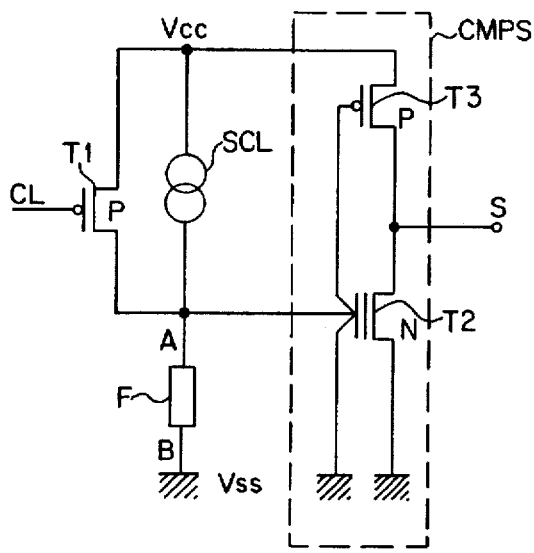
FIG. 2 shows a schematic drawing of the fuse blowing control and fuse state reading circuit.

FIG. 2 shows a simple example illustrating the principles of this circuit. Circuits of greater sophistication may be provided.

The fuse is designated by the reference F in FIG. 2.

The terminal B of the fuse is connected to the ground Vss which is the lowest voltage of the circuit, to which the substrate of an integrated circuit is usually connected when it is of the P type.

The terminal A of the fuse is connected to a terminal of a breakdown transistor T1, the other terminal of which is connected to a positive supply terminal Vcc of the integrated circuit. This voltage is the normal supply voltage of the integrated circuit, for example about 3–5 volts, because the principle of the fuse described in this invention does not require any particularly high blow-out voltage, unlike the fuses used in EPROM memory cells.

The gate of the blow-out transistor T1 may receive a blow-out command CL. This command is a voltage that enables the transistor T1 to be made conductive. The command voltage is a positive voltage with respect to Vss if T1 is an N channel transistor, and it is a zero voltage or a voltage close to Vss if T1 is a P channel transistor).

The dimensions of the transistor T1 are chosen so as to let through a current sufficient for the current density at the contact 22 to result in a temperature rise that will cause the contact metal to diffuse into the semiconductor. According to one embodiment, transistor T1 is capable of letting through one milliampere.

The blow-out command circuit may be as simple as only this transistor T1.

For reading the state of the fuse, there is provided a circuit comprising a current source SCL to direct a read current of some microamperes into the fuse, from the terminal A to the terminal B. The current source is therefore connected between the terminal Vcc and the terminal A of the fuse. There is therefore a current bias of the fuse in a direction causing the NP junction to be forward-biased. The terminal A is furthermore connected to the input of a threshold comparator CMPS that has an output S. The signal appearing at output terminal S indicates whether the voltage at A is greater than or lower than a predetermined threshold.

According to one embodiment of the invention, the threshold of this comparator is at least about 0.5 volts, and preferably about 0.2 volts to 0.3 volts.

If the voltage at A (measured with respect to the ground Vss) is greater than this threshold, the fuse is considered to be intact. If it is lower, the fuse is considered to be blown.

In the example shown in FIG. 2, the threshold comparator is constituted quite simply by an N type transistor T2 with a very low threshold voltage (Vt equal to about 0.2 volts). This transistor has its gate connected to the terminal A and it is series-connected with a P channel bias transistor T3 that is made conductive by its gate connected to the ground Vss. A transistor T2 with a very low threshold voltage is obtained by avoiding the doping of its channel with P type impurities as is done for other N channel transistors of the circuit which rather have a threshold voltage of about 1 volt. Consequently, the transistor T2 is a so-called "native" transistor. The point of junction between the drains of the transistors T2 and T3 constitute the output S of the comparator and makes it possible to give a signal representing the state of the fuse: the signal is close to Vss if the fuse is intact and close to Vcc if the fuse is blown. This signal may be used as desired, for example to prohibit a path of access to one zone or another of the integrated circuit, notably when the circuit is that of a chip card.

Figure 3:
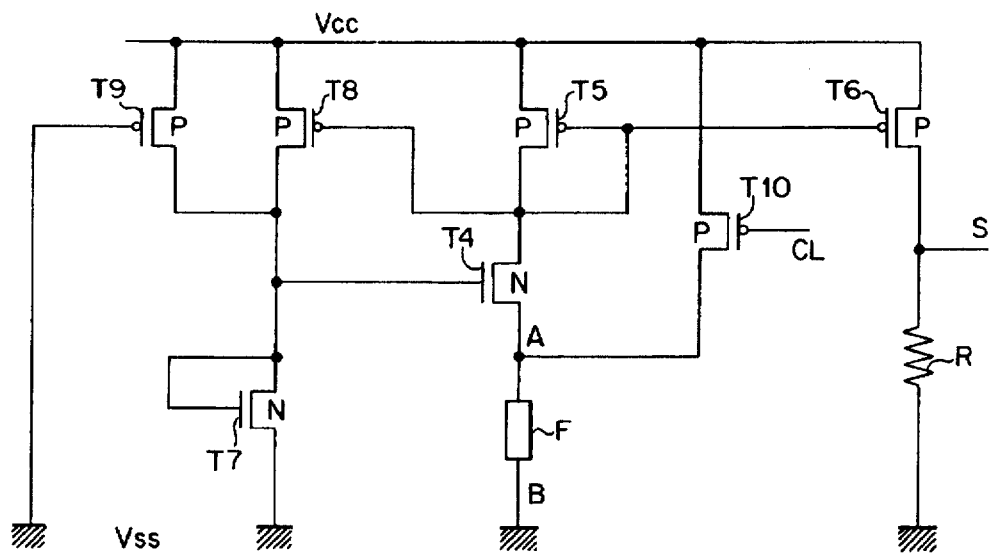
FIG. 3 shows another schematic drawing of the blowing and detection circuit.

FIG. 3 shows another example of a circuit for controlling and reading the state of the fuse. In this drawing, the fuse F is supplied by a voltage generator (N channel transistor T4 having its source connected to the terminal A and its drain connected to a P channel transistor T5 furthermore connected to Vcc). The biasing of the fuse is therefore rather a voltage biasing. It is such that the NP junction tends to be forward-biased. The voltage applied in this embodiment may be tenths of volts, for example. This is obtained through a biasing of the gate of T4 by a transistor T7 and a transistor TS. The N channel transistor T7 is connected as a diode between the gate of T4 and the ground Vss. The transistor T8 is connected between Vcc and T7 and gives a supply current to T7. In this example, this current is obtained by a current mirror (TS, TS) from the current flowing through the fuse. This sets up a negative feedback between the current flowing through the fuse and the voltage bias of this fuse. This feedback has the advantage of increasing the dynamic range of variation of the output signal.

For reading of the state of the fuse, a circuit is provided to convert the current flowing through the fuse into voltage. For this purpose, there is provided a transistor T6, connected as a current mirror with respect to T5. This current mirror mirrors the current in the fuse in a resistor R. The junction point between the resistor R and the transistor T6 is the output S of the circuit. If the fuse is intact, the current that flows through it is relatively low and the current in the resistor R is also low. The voltage at the terminal S is close to Vss. If, on the contrary, the fuse is blown, the current is far greater in the fuse and therefore is correspondingly greater in the resistor R. The voltage at the output S approaches Vcc. It is thus possible to detect the state of the fuse.

A transistor T9 (P channel transistor) connected between Vcc and the gate of T4 ensures that the circuit starts up properly when the voltage is turned on but does not play any role thereafter. It has very low capacity to conduct current, because it has a great length and small width.

Finally, a transistor T10 capable of conducting substantial current plays the role of the transistor T1 of FIG. 1 to blow the fuse.

Figure 4:
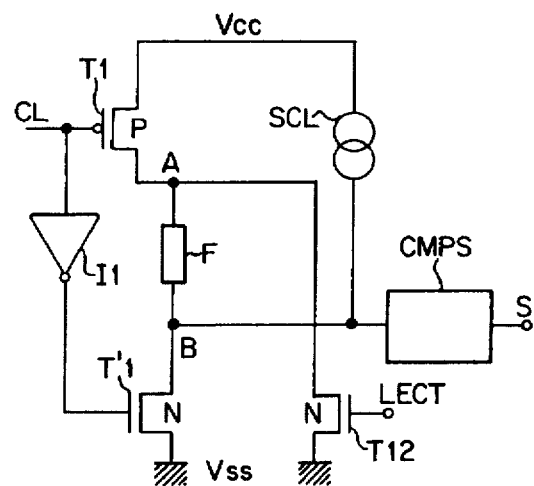
FIG. 4 shows an alternativeschematic drawing illustrating reading of a reverse biased junction.

In yet another embodiment, shown in FIG. 4, reading is done by reverse biasing of the NP junction between the doped region 12 and the well 11. The end A of the fuse is grounded, and the end B disconnected from the ground for purposes of reading the state of the fuse. To this end, it is necessary to provide, firstly, for an isolation transistor T'1 between the terminal B and the ground and, secondly, a transistor T12 to connect the terminal A to the ground.

The transistor T'1 is made conductive at the same time as T1 for the blowing of the fuse, both responsive to the blow-out signal CL. The transistor T'1 is non-conductive for reading the state of the fuse. This transistor should be as big as the transistor T1 since it also carries the fuse blow-out current. If the transistor T1 is a P channel transistor and the transistor T'1 is an N channel transistor, an inverter I1 receives the blow-out signal CL applied to T1 and reverses it to apply it to the control gate of T'1.

The transistor T12 which is used to connect the terminal A to the ground may be a small N channel transistor. It carries only a small reading current. It is put into a state of conduction for the reading operation by a read signal LECT present outside periods reserved for the blowing out of the fuse.

The read circuit may be similar to that of FIG. 2, with a source SCL for the supply of current to the fuse through the terminal B and a simple threshold comparator CMPS connected to the terminal B to detect the logic level present at the terminal B. The threshold of the comparator is far less critically important than in the case of the reading when the junction is forward biased. It may be equal to about 2 volts for a 5-volt supply but the input is then the terminal B and not the terminal A of the fuse.

The read circuit could also be of the same type as that of FIG. 3 with, once again, a reversal of the terminals A and B and the addition of the transistors T'1 and T12 to achieve this reversal of bias between reading and blowing.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A method of irreversibly locking a portion of a semiconductor device using only a supply voltage and ground voltage used in the semiconductor device, comprising the steps of:
   (i) forming in the semiconductor device an NP junction;
   (ii) forming on a surface of the semiconductor device, in contact with the NP junction a metallization layer;
   (iii) applying a bias current to the NP junction;
   (iv) comparing a voltage measured across the NP junction with a predetermined threshold voltage, to produce a locking signal output; and
   (v) irreversibly locking the portion of the semiconductor device, by applying a forward current at a low voltage for a duration of several seconds to the NP junction, the current producing a current density between the metallization layer and the NP junction to heat the metallization layer and the NP junction just sufficiently, to diffuse metal from the metallization layer into the NP junction and short-circuit the NP junction.

2. The method of claim 1, wherein the step (iii) further comprises the step of:
   forward-biasing the NP junction to produce a voltage drop thereacross before short-circuiting which is different from a voltage drop across the NP junction after short-circuiting.

3. The method of claim 2; wherein a P side of the shallow NP junction is electrically disconnected from the supply voltage of the semiconductor device during step (iv), and wherein the step (v) further comprises the step of:
   connecting the P side of the shallow NP junction to the supply voltage of the semiconductor device.

4. The method of claim 1, wherein the step (iii) further comprises the step of:
   reverse-biasing the NP junction to produce a voltage drop thereacross before short-circuiting which is different from a voltage drop across the NP junction after short-circuiting.

5. The method of claim 4, wherein an N side of the shallow NP junction is electrically disconnected from the ground voltage of the semiconductor device and a P side of the shallow NP junction is electrically disconnected from the supply voltage of the semiconductor device during step (iv), and wherein the step (v) further comprises the step of:
   connecting the N side of the NP junction to the ground voltage of the semiconductor device; and
   connecting the P side of the NP junction to the supply voltage of the semiconductor device.

6. A method of irreversibly locking a portion of a semiconductor device using only a supply voltage and a ground voltage used in the semiconductor device, comprising the steps of:
   (i) forming on the semiconductor device an NP junction;
   (ii) forming on a surface of the semiconductor device, at the NP junction a metallization layer;
   (iii) applying a bias voltage to the NP junction, whereby an NP junction current is developed;
   (iv) mirroring the NP junction current into a resistor;
   (v) comparing a voltage measured across the resistor with a threshold, to produce a locking signal output; and
   (vi) irreversibly locking the portion of the semiconductor device, by applying a forward bias to the NP junction to diffuse metal from the metallization layer into the NP junction and short-circuit the NP junction.

7. The method of claim 6, wherein the step (iii) further comprises the step of:
   forward-biasing the NP junction to produce by the step of mirroring a voltage drop across the resistor before short-circuiting the NP junction different from a voltage drop across the resistor after short-circuiting the NP junction.

8. The method of claim 7, wherein a P side of the NP junction is electrically disconnected from the supply voltage of the semiconductor device during step (v), and wherein the step (vi) further comprises the step of:
   connecting the P side of the NP junction to the supply voltage of the semiconductor device.

9. A method of irreversibly locking a portion of a semiconductor device using only a supply voltage and ground voltage used in the semiconductor device, comprising the steps of:
   (i) forming in the semiconductor device an NP junction;
   (ii) forming on a surface of the semiconductor device, in contact with the NP junction a metallization layer of aluminum;
   (iii) applying a bias current to the NP junction;
   (iv) comparing a voltage measured across the NP junction with a predetermined threshold voltage, to produce a locking signal output; and (v) irreversibly locking the portion of the semiconductor device, by applying a forward current at a low voltage for a duration of several seconds to the NP junction, the current producing a current density between the metallization layer and the NP junction to heat the metallization layer and the NP junction just sufficiently, to diffuse aluminum from the metallization layer into the NP junction and short-circuit the NP junction.

10. The method of claim 9, wherein the step (iii) further comprises the step of: forward-biasing the NP junction to produce a voltage drop thereacross before short-circuiting which is different from a voltage drop across the NP junction after short-circuiting.

11. The method of claim 10, wherein a P side of the shallow NP junction is electrically disconnected from the supply voltage of the semiconductor device during step (iv), and wherein the step (v) further comprises the step of:

connecting the P side of the shallow NP junction to the supply voltage of the semiconductor device.

12. The method of claim 9, wherein the step (iii) further comprises the step of:

reverse-biasing the NP junction to produce a voltage drop thereacross before short-circuiting which is different from a voltage drop across the NP junction after short-circuiting.

13. The method of claim 12, wherein an N side of the shallow NP junction is electrically disconnected from the ground voltage of the semiconductor device and a P side of the shallow NP junction is electrically disconnected from the supply voltage of the semiconductor device during step (iv), and wherein the step (v) further comprises the step of:

connecting the N side of the NP junction to the ground voltage of the semiconductor device; and connecting the P side of the NP junction to the voltage of the semiconductor device.

14. A method of irreversibly locking a portion of a semiconductor device using only a supply voltage and ground voltage used in the semiconductor device, the semiconductor device including an NP junction having a metallization layer in contact therewith, comprising the steps of:

(i) applying a bias current to the NP junction;

(ii) comparing a voltage measured across the NP junction with a predetermined threshold voltage, to produce a locking signal output; and (iii) irreversibly locking the portion of the semiconductor device, by applying a forward current at a low voltage for a duration of several seconds to the NP junction, the current producing a current density between the metallization layer and the NP junction to heat the metallization layer and the NP junction just sufficiently, to diffuse metal from the metallization layer into the NP junction and short-circuit the NP junction.

15. The method of claim 14, wherein the step (i) further comprises the step of:

forward-biasing the NP junction to produce a voltage drop thereacross before short-circuiting which is different from a voltage drop across the NP junction after short-circuiting.

16. The method of claim 15, wherein a P side of the shallow NP junction is electrically disconnected from the supply voltage of the semiconductor device during step (ii), and wherein the step (iii) further comprises the step of:

connecting the P side of the shallow NP junction to the supply voltage of the semiconductor device.

17. The method of claim 14, wherein the step (i) further comprises the step of:

reverse-biasing the NP junction to produce a voltage drop thereacross before short-circuiting which is different from a voltage drop across the NP junction after short-circuiting.

18. The method of claim 17, wherein an N side of the shallow NP junction is electrically disconnected from the ground voltage of the semiconductor device and a P side of the shallow NP junction is electrically disconnected from the supply voltage of the semiconductor device during step (ii), and wherein the step (iii) further comprises the step of:

connecting the N side of the NP junction to the ground voltage of the semiconductor device; and connecting the P side of the NP junction to the voltage of the semiconductor device.

* * * * *